(12) United States Patent
Sitti et al.

(10) Patent No.: US 11,084,718 B2
(45) Date of Patent: Aug. 10, 2021

(54) METHOD FOR PRODUCING A STRUCTURE WITH SPATIAL ENCODED FUNCTIONALITY

(71) Applicant: Max-Planck-Gesellschaft zur Förderung der Wissenschaften e.V., Munich (DE)

(72) Inventors: Metin Sitti, Stuttgart (DE); Hakan Ceylan, Stuttgart (DE); Immihan Ceren Yasa, Stuttgart (DE)

(73) Assignee: Max-Planck-Gesellschaft zur Forderung der Wissenschaften e.V., Munich (DE)

( * ) Notice: Subject to any disclaimer, the term of this patent is extended or adjusted under 35 U.S.C. 154(b) by 10 days.

(21) Appl. No.: 15/725,945

(22) Filed: Oct. 5, 2017

(65) Prior Publication Data
US 2018/0099869 A1    Apr. 12, 2018

(30) Foreign Application Priority Data
Oct. 7, 2016    (EP) .................................... 16192767

(51) Int. Cl.
*B81C 3/00*    (2006.01)
*B81C 1/00*    (2006.01)
(Continued)

(52) U.S. Cl.
CPC .......... *B81C 3/001* (2013.01); *B81C 1/00214* (2013.01); *B81C 3/005* (2013.01);
(Continued)

(58) Field of Classification Search
CPC .... G03F 7/0027; G03F 7/0037; G03F 7/2053; G03F 7/161; G03F 7/40; G03F 7/22;
(Continued)

(56) References Cited

U.S. PATENT DOCUMENTS 4,970,129 A * 11/1990 Ingwall .................. G03F 7/001
                                                       359/3
6,316,153 B1 * 11/2001 Goodman ............ A61K 9/0097
                                                        430/8
(Continued)

FOREIGN PATENT DOCUMENTS

CN         103864964 B      1/2016

OTHER PUBLICATIONS

Hoffmann et al., "Three-dimensional photolithographic patterning of multiple bioactive ligands in poly(ethylene glycol) hydrogels", Soft Matter, vol. 6 pp. 5056-5063 (2010).*

(Continued)

*Primary Examiner* — Martin J Angebranndt
(74) *Attorney, Agent, or Firm* — Harness, Dickey & Pierce, P.L.C.

(57) ABSTRACT

The invention relates to a method for producing a structure with spatial encoded functionality, the method comprising:
  providing in a volume (114) a first photosensitive material (116) that is two-photon crosslinking compatible,
  generating in the volume (114) a framework of cross-linked first photo-sensitive material (116), the generating of the framework comprising exposing the first photosensitive material (116) with a first focused laser beam (118) according to a first pattern for specifically initiating a two-photon crosslinking of the first photo-sensitive material (116) in accordance with the first pattern,
  removing from the volume (114) any remaining non-crosslinked portions of the first photosensitive material (116),
  providing to the volume (114) a second photosensitive material (116) that is two-photon crosslinking compatible, (Continued)

generating in the volume (114) the structure, the generating of the structure comprising exposing the second photosensitive material (116) with a second focused laser beam (118) according to a second pattern for specifically initiating a two-photon crosslinking of predefined surface portions of the framework and the second photosensitive material (116) in accordance with the second pattern, removing from the volume (114) any remaining non-crosslinked portions of the second photosensitive material (116).

13 Claims, 7 Drawing Sheets

(51) Int. Cl.
| | |
|---|---|
| B82Y 40/00 | (2011.01) |
| G03F 7/20 | (2006.01) |
| G03F 7/004 | (2006.01) |
| G03F 7/027 | (2006.01) |
| G03F 7/038 | (2006.01) |
| G03F 7/00 | (2006.01) |
| G03F 7/16 | (2006.01) |
| G03F 7/22 | (2006.01) |
| G03F 7/40 | (2006.01) |
| G03F 7/04 | (2006.01) |

(52) U.S. Cl.
CPC ............ B81C 3/008 (2013.01); G03F 7/0027 (2013.01); G03F 7/0037 (2013.01); G03F 7/038 (2013.01); G03F 7/04 (2013.01); G03F 7/161 (2013.01); G03F 7/2053 (2013.01); G03F 7/22 (2013.01); G03F 7/40 (2013.01); B82Y 40/00 (2013.01)

(58) Field of Classification Search
CPC .... G03F 7/70383; G03F 7/70416; G03F 7/04; G03F 7/20153; B81C 3/001; B81C 3/005; B81C 3/008; B81C 1/00214; B82Y 40/00
See application file for complete search history.

(56) References Cited

U.S. PATENT DOCUMENTS

| | | | | |
|---|---|---|---|---|
| 2004/0172973 | A1* | 9/2004 | Chen ............... | C03B 19/12 65/17.2 |
| 2005/0124712 | A1* | 6/2005 | Anderson ............. | B82Y 20/00 522/1 |
| 2010/0279886 | A1* | 11/2010 | Fauchet ............. | G01N 21/7743 506/9 |
| 2011/0021653 | A1* | 1/2011 | Zheng ................... | A61L 27/14 522/2 |
| 2011/0131309 | A1* | 6/2011 | Akiyama ............... | H04L 12/14 709/223 |
| 2012/0228802 | A1* | 9/2012 | Kan ..................... | B29C 64/135 264/401 |
| 2013/0012612 | A1* | 1/2013 | Houbertz-Krauss ..... | C07H 9/04 522/89 |
| 2013/0084449 | A1* | 4/2013 | Lewis .................... | A61L 27/16 428/221 |
| 2016/0324985 | A1* | 11/2016 | Nabatian ................ | A61K 47/36 |

OTHER PUBLICATIONS

Torgersen et al., "Hydrogels for two-photon polymerization: A Toolbox for mimicking the extracellular matrix", Adv. Funct. Mater., vol. 23 pp. 4542-4554 (2013).*

Hoffmann et al., "Three-dimensional photolithographic micropatterning: A novel tool to probe the complexities of cell migration", Integr,. Biol., vol. 5(5) pp. 817-827 (May 2013) (Via NIH public access PMC 2014).*

Sun et al., "Three dimensional photonic crystal structures achieved with two-photon absorption photopolymerization of resin", Appl. Phys. Lett., vol. 74(6) pp. 786-788 (Feb. 1999).*

Li et al. "3D alkyne-azide cycloaddition statiotemporally controled by combination of aryl azide photochemistry and two-photon grafting", Chem. Commun., vol. 49 pp. 7635-7637 (2013).*

Kahveci et al., "Photoinduced in situ formation of clickable PEG hydrogels and their antibody conjugation", Design. Mono. Polym., vol. 18(2) pp. 129-136 (2015).*

Jiang et al. "Direct writing target structure by two-photon polymerization" Fusion Sci. & Technol., vol. 70 pp. 295-309 (Aug. 9, 2016).*

Svec et al., "Advances and recent trends in the field of monolithic columns for chromoatography", Anal. Chem. vol. 87 pp. 250-273 (Nov. 2014).*

Wu et al., "Boronic affinity monolith with gold nanoparticle-modified hydrophilic polymer as a matrix for the highly specific capture of glycoproteins", Chem. Eur. J. vol. 20 pp. 8737-8743 (2014).*

Lee et al., "Grafting of poly(acrylic acid)on the poly(ethylene glycol) hydrogel using surface-initiated photopolymerization for covalent immobilization of collagen". J. Ind. Eng. Chem., vol. 13(7) pp. 1195-1200 (2007).*

Buividas et al., "Optical and thermal characterization on micro-optical elements made by femtosecond laser writing", Proc. SPIE vol. 8923, article 89234X (9 pages) (Dec. 2013).*

Medina-Sanchez, et al., "Rapid 3D printing of complex polymeric tubular catalytic micromotors", 2016 International conference on manipulation, automations and robotics at small scales (MARSS), pp. 1-6 (added to IEEE xplore, on Sep. 8, 2016), presented Jul. 18-22, 2016 (Paris).*

Zhu et al. "3-D-printed artificial microfish", Adv. Mater., vol. 27 pp. 4411-4417 (2015).*

European Search Report issued in European Patent Application No. 16192767.8 dated Mar. 24, 2017, 6 pages.

Quick, Alexander S. et al., Fabrication and Spatially Resolved Functionalization of 3D Microstructures via Multiphoton-Induced Diels-Alder Chemistry, Advanced Functional Materials, vol. 24, No. 23, Jun. 10, 2014, pp. 3571-3580.

Kufelt, Olga et al., Hyaluronic Acid Based Materials for Scaffolding via Two-Photon Polymerization, Biomacromolecules, vol. 15, No. 2, Feb. 10, 2014, pp. 650-659.

* cited by examiner a)

$h_s$ - Swimmer height, 24 μm
$r_n$ - Nozzle radius, 4 μm
$r_s$ - Bottom radius, 12 μm
$r_e$ - Engine radius, 6 μm
$h_e$ - Engine height, 12 μm Side view Sectional view b)

c)   d)   e)

f)

g)

h)

j)

i)

METHOD FOR PRODUCING A STRUCTURE WITH SPATIAL ENCODED FUNCTIONALITY

TECHNICAL FIELD

The invention relates to a method for producing a structure with spatial encoded functionality, a computer program product and an apparatus for producing a structure with spatial encoded functionality.

BACKGROUND AND RELATED ART

Miniaturization of functional (soft) materials down to the scale of micrometers promise unique applications in various fields, including biomedicine (e.g., active targeted drug delivery materials and devices), bioengineering (e.g., programmable tissue constructs), active matter (e.g., self-propelled microswimmers), and robotics (e.g., soft robots, mobile microrobots). Eventually, a functional device at an average size of a single cell with well-designed on-board sensing, actuation and self-powering capabilities might provide an unprecedented direct access to deep and complex body sites, such as brain, spinal cord, and eye, for minimally invasive future clinical operations, such surgery or therapeutic cargo delivery. Still far-fetched to realize this goal, though, a growing attention has been given towards this direction with the prospect of transforming many aspects of healthcare and bioengineering in the future.

Physical realization of sophisticated functional devices below sub-millimeter length scale presents unique challenges pertaining to (i) design, (ii) fabrication and (iii) spatiotemporal encoding of functionality. Despite the progress that has been made in design and fabrication methods of hydrogels over the past decade, the resulting features with the conventional microfabrication are relatively simple geometric structures with limited design flexibility and function. To address the design and fabrication challenges, application of additive manufacturing processes on the micro-scale has opened up a new terrain of design freedom by enabling computer-aided designs (CAD) at sub-millimeter scales. In this regard, microprinting via two-photon crosslinking (TPC) has emerged in the recent years by enabling complex microfabrication of light-sensitive resins with a submicrometer precision and feature size down to 100 nm in three dimensions. Transformative achievements have already been made mainly in structurally demanding materials, such as aperiodic photonic structures, mechanical metamaterials, 3D scaffolds for cells, and microfluidic devices and filters. Microprinting by means of TPC is accomplished by the interaction of focused femtosecond laser radiation with a photosensitive material in a highly-confined volume called voxel. This interaction leads to generation of radicals that react with the precursor monomers resulting in curing, or polymerization, of the material within the voxel. Therefore, the photosensitive material is crosslinked along computer-controlled trajectories assigned for the sample stage moving with respect to the laser focus, in all dimensions, and enabling complex 3D structures by direct writing in the volume of photosensitive material.

Despite the high degree of structural information that could be encoded by the TPC microprinting, the resulting materials lack the chemical versatility. This not only severely limits the current designs to functionally passive systems, which are incapable of on-board energy generation and conversion, a prerequisite in order to autonomously function, but also significantly reduces the achievable complexity of the devices that would otherwise exhibit multiple functionalities in a single structure.

For example, U.S. Pat. No. 7,803,514 B2 discloses a photosensitive composition that includes a multifunctional photosensitive resin.

It is an objective of the invention to provide for an improved method for producing a structure with spatial encoded functionality, a computer program product and an improved apparatus for producing such a structure.

SUMMARY OF THE INVENTION

The invention is described by the independent claims. Embodiments of the invention are described by the dependent claims.

Embodiments of the invention provide for a method for producing a structure with spatial encoded functionality, the method comprising:
  providing in a volume a first photosensitive material that is two-photon crosslinking compatible,
  generating in the volume a framework of crosslinked first photosensitive material, the generating of the framework comprising exposing the first photosensitive material with a first focused laser beam according to a first pattern for specifically initiating a two-photon crosslinking of the first photosensitive material in accordance with the first pattern,
  removing from the volume any remaining non-crosslinked portions of the first photosensitive material,
  providing to the volume a second photosensitive material that is two-photon crosslinking compatible,
  generating in the volume the structure, the generating of the structure comprising exposing the second photosensitive material with a second focused laser beam according to a second pattern for specifically initiating a two-photon crosslinking of predefined surface portions of the framework and the second photosensitive material in accordance with the second pattern,
  removing from the volume any remaining non-crosslinked portions of the second photosensitive material.

Embodiments may have the advantage that on the micron scale advanced materials with sophisticated functionalities can be created. Precise spatiotemporal control of two-photon crosslinking is employed as an enabling tool for 3D patterning of micro-printed materials with versatile chemical moieties. The light-sensitive first material is used as a model material to microprint a chemically uniform framework. To encode spatial functionality, the second material is selectively inserted to the pre-determined locations with down to sub-micron spatial resolution. Thus, embodiments may allow for tailoring the local chemical properties through controlled (preferably 3D) patterning for encoding many advanced functionalities, hence leading to novel design opportunities for creating advanced functional micromaterials.

With the first main step of the method the framework of cross-linked first photosensitive material is generated. For example, a structurally well-defined, chemically uniform and nonfunctional 3D micromaterial is resulting. Removing the remaining non-cross-linked portions of the first photosensitive material may ensure that for the subsequent second main step of generating the structure accidental cross-linking of the second photosensitive material with any remaining undesired first photosensitive material is avoided. For example, unreacted first photosensitive material may be dissolved in a certain solvent and washed away.

The provision of the second photosensitive material to the volume may be performed in such a manner that the molecules of the second photosensitive material are able to preferably automatically move to the spatial locations where the second focused laser beam will later on be applied. The movement of the molecules of the second photosensitive material may be due to for example diffusion processes or a simple flow of the molecules of the second photosensitive material in case the framework is immersed in a liquid of the second photosensitive material.

In the described second main step of generating the structure, local parts of the framework are selectively addressed for chemical patterning using the molecules of the second photosensitive material such that the molecules of the second photo-sensitive material are e.g. covalently linked to the existing network.

The second main step of generating the structure may be repeated for multiple times at various locations of the framework depending on the functional complexity required for a given application.

In accordance with an embodiment of the invention, the structure is a three dimensional structure. Even though, in the following the disclosure only discusses a three dimensional structure and framework, it is evident for the skilled person that this also covers the application of the method to a two dimensional structure and framework.

It has to be noted that even though the present disclosure further uses the term "two-photon crosslinking" this is considered within the disclosure to be a synonym for "two-photon polymerization". The main difference between polymerization and crosslinking can be seen in reference to the size or length of the polymerizable species. Photopolymerization and photo-crosslinking can occur simultaneously if the monomer has more than one reactive functional units, and the overall result is a highly crosslinked polymer network as in photo-crosslinking.

Further, it has to be noted that the term "functionality" is to be understood in a broad manner. The functionality may encompass for example a chemical functionality, a mechanical functionality, an optical functionality, a medical functionality. A chemical functionality may for example be given with respect to a dedicated reactivity in case the structure is exposed to certain environmental conditions like a fluid with a certain pH value. A mechanical functionality may be given with respect to the capability to change the shape of the structure in case the structure is exposed to certain environmental conditions like an external magnetic field or an external electric field. A mechanical functionality may also be given by the static geometric shape of the structure such that the structure may serve for example as a microfluidic device or filter. An optical functionality may be given by the capability of the structure to absorb, reflect or transmit light. For example, a regular arrangement of functional groups of the structure may have the function of a diffraction grating. A medical functionality may be given by the capability of the microstructure to interact with bacteria, viruses, cells or fluid molecules of living organisms. Another application of medical functionality would be usage of the structure as microfabricated bioreactor that stimulates stem cells with both mechanical and biochemical cues.

After the removal of the remaining non-crosslinked portions of the second photo-sensitive material, the remaining crosslinked portions of the second photosensitive material may have reactive sites. In accordance with an embodiment, the method may further comprise chemically modifying at least part of the reactive sites with one or more chemicals until the sites possess the desired encoded functionality, wherein the chemicals are selected in such a manner that during the modification the chemicals behave chemically inert to the first photosensitive material.

It may be beneficial that after the removal of the remaining non-crosslinked portions of the second photosensitive material and before performing the chemical modification, the method comprises defunctionalizing any reactive sites of the framework that are reactive to the one or more chemicals used for performing the chemical modification. Thus, it may be ensured that only the reactive sites of the second photosensitive material are indeed notified by the one or more chemicals.

In accordance with an embodiment of the invention, the encoded functionality may be given by the remaining crosslinked portions of the second photosensitive material. However, the subsequent usage of the one or more chemicals may be necessary in case the desired functional property of the structure is not immediately given by the cross-linked second photosensitive material itself but in case further chemical groups or particles like metallic particles have to be attached to the reactive sites in order to generate the desired encoded functionality.

In accordance with an embodiment of the invention, the chemical modification with the one or more chemicals may comprise immersing the structure subsequently in the one or more chemicals. Due to the immersion of the structure in the one or more chemicals that reactive sites of the second photosensitive material are modified step-by-step until the desired functionality is achieved.

In accordance with an embodiment of the invention, the removal from the volume of any remaining non-cross-linked portions of the first photosensitive material is comprising a dissolving of the non-cross-linked portions in a solvent.

In accordance with an embodiment of the invention, the first and/or second pattern is defining spatial features of the first and/or second photosensitive material at a resolution in between 5 nm and 500 µm, preferably between 20 nm and 50 µm. Thus, with extremely high accuracy the method may permit generating structures in the sub micrometer range.

In accordance with an embodiment of the invention, the first and the second photosensitive material are each provided to the volume homogeneously together with a respective photoinitiator, the photoinitiator being adapted for initiating the two photon cross-linking of the monomers of the photosensitive material upon the exposure of the photoinitiator to the respective first and second focused laser beam. Thus, for example through electron transfer by a radical generated by the exposure of the photoinitiator to the laser beam, the respective first and second photosensitive material is cross-linked. The polymerization (or crosslinking) in the photosensitive material is thus initiated by small molecules of the photoinitiator which exhibits a high level of absorption at the specific wavelength of light used in the process. Examples of photoinitators are eosin Y, 1-cyclohexyl phenyl ketone, 2,2-dimethoxy-2-phenylacetophenone (DMPA), 2-hydroxy-1-[4-(hydroxyethoxy) phenyl]-2-methyl-1-propanone (Irgacure 2959; D2959; 12959), Irgacure 369.

In accordance with an embodiment of the invention, the first photosensitive material is a hydrogel. For example, the hydrogel is a preferably water swollen, photocurable network of a derivative of anyone of the following: polyvinyl alcohol (PVA), polyethylene glycol (PEG), polyethylene oxide (PEO), poly(2-hydroxyethyl methacrylate) (PHEMA), polyacrylamide (PAM), gelatin and protein derivatives. Further, the derivative may be an acrylate or methacrylate resin. Especially the derivatives of PVA, PEG, PEO, gelatin, and other proteins have the advantage that they present a superb biocompatibility such that the above described method may provide for a versatile microfabrication tool for biomedical applications.

In accordance with an embodiment of the invention, the hydrogel is poly(ethylene glycol) diacrylate (PEGDA).

It has to be noted that this method may generally be applied to any optically clear, light-sensitive material, paving the way to engineering a new generation of geometrically and chemically programmable, functionally active and passive micromaterials that can accomplish previously unconceivable active tasks.

In another aspect, the invention relates to a computer program product comprising computer executable instructions to perform the method as described above.

In another aspect, the invention relates to an apparatus for producing a structure with spatial encoded functionality, the apparatus comprising a processor and a memor comprising instructions (106), wherein execution of the instructions by the processor causes the processor to control the apparatus to:
provide in a volume a first photosensitive material that is two-photon crosslinking compatible,
generate in the volume a framework of crosslinked first photosensitive material, the generating of the framework comprising exposing the first photosensitive material with a first focused laser beam according to a first pattern for specifically initiating a two-photon crosslinking of the first photosensitive material in accordance with the first pattern,
remove from the volume any remaining non-crosslinked portions of the first photosensitive material,
provide to the volume a second photosensitive material that is two-photon crosslinking compatible,
generate in the volume the structure, the generating of the structure comprising exposing the second photosensitive material with a second focused laser beam according to a second pattern for specifically initiating a two-photon crosslinking of predefined surface portions of the framework and the second photosensitive material in accordance with the second pattern,
remove from the volume any remaining non-crosslinked portions of the second photosensitive material.

It is understood that one or more of the aforementioned embodiments of the invention may be combined as long as the combined embodiments are not mutually exclusive.

BRIEF DESCRIPTION OF THE DRAWINGS

In the following preferred embodiments of the invention are described in greater detail by way of example only, making reference to the drawings in which.

In order to produce sub-micrometer sized structures, especially in three dimensions, two-photon crosslinking (TPC) is used. TPC is used as an enabling tool for programming 3D chemical properties of microprinted materials on the size scale from nanometers to hundreds of microns, with the final aim of encoding functional material properties. By controlling the two-photon occurrence at any location in 3D, non-invasive covalent insertion of functional moieties at any arbitrary microprinted complex material may be possible. To realize this goal, TPC chemistry was exploited at two complementary steps. First, a complex CAD design is physically realized by TPC-compatible polymer precursors resulting in structurally well-defined, chemically uniform and non-functional 3D micromaterials. Two-photon-initiated acrylate-crosslinking chemistry provided by PEGDA may for example be used as a model substrate because it is inexpensive and transparent at near-infrared light, ~785 nm, and thereby meeting the minimum criteria for microfabrication by TPC. Polyethylene glycol-based networks are relatively simple enough to be regarded as a blank material, to which desired functional groups could be attached. Further, PEGDA hydrogels are mostly regarded biocompatible and anti-fouling materials, and thereby having a strong relevance for being used in biomedical applications. Second, local parts of 3D microstructures are selectively addressed for chemical patterning using functional molecules with only one-side acrylated so that they are covalently linked to the existing network to display the functional groups in a spatiotemporally programmed way. The patterning strategy can be repeated for multiple times at various locations of the material depending on the functional complexity required for a given application.

Figure 1:
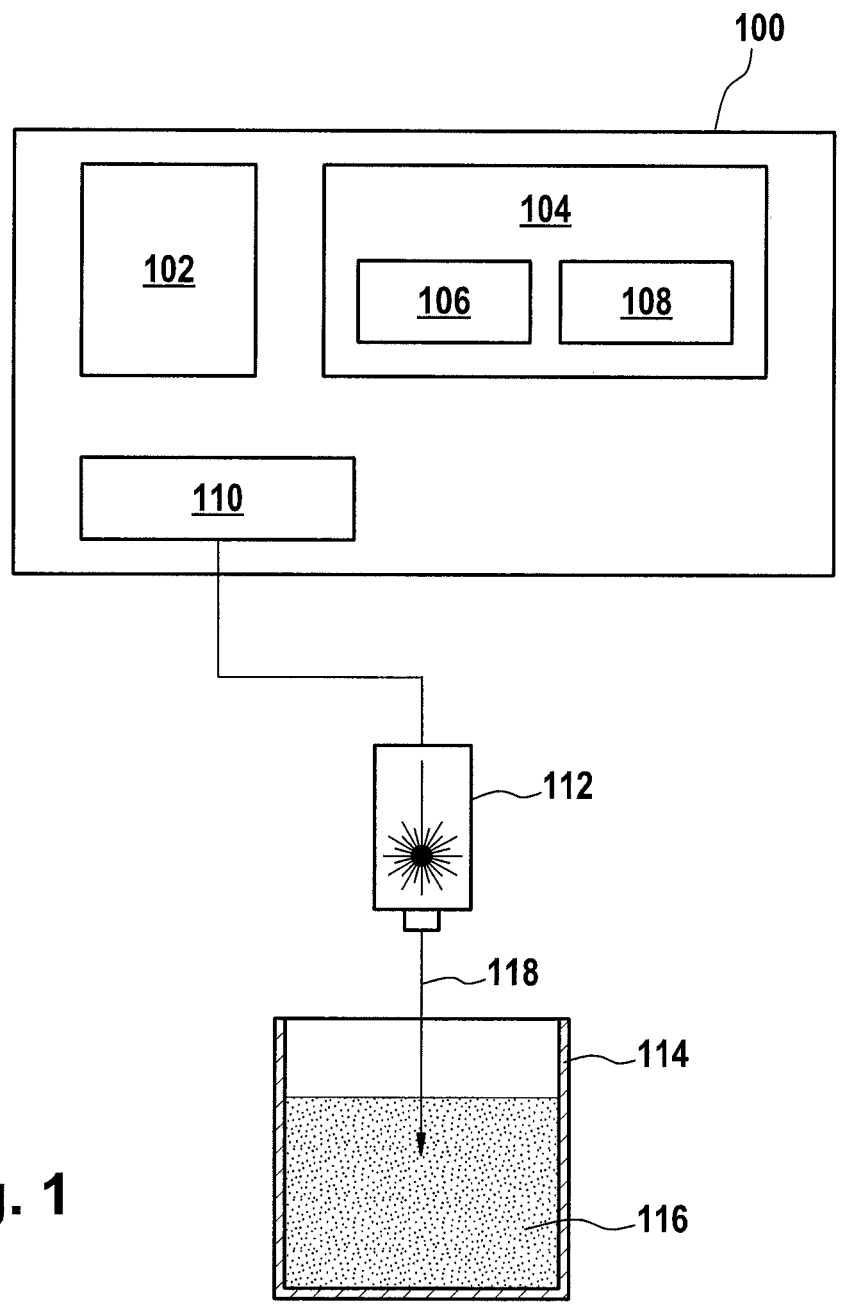
FIG. 1 is a block diagram illustrating a system for producing a structure with spatial encoded functionality.

FIG. 1 is a block diagram illustrating a system for producing a structure with spatial encoded functionality, for example a 3D framework of the above described PEGDA having covalently attached functional groups at predefined dedicated locations of the 3D framework. A controller 100 comprises a processor 102 and a memory 104. The memory has computer executable instructions 106 that can be executed by the processor 102. Further, the memory 104 has stored patterns 108, wherein upon execution of the instructions 106 a laser source 112 is emitting a laser beam 118 with a focus of the laser beam 118 being at specific 3D locations as specified by the patterns 108. The laser source 112 is coupled to the controller 100 via an interface 110.

Figure 4:
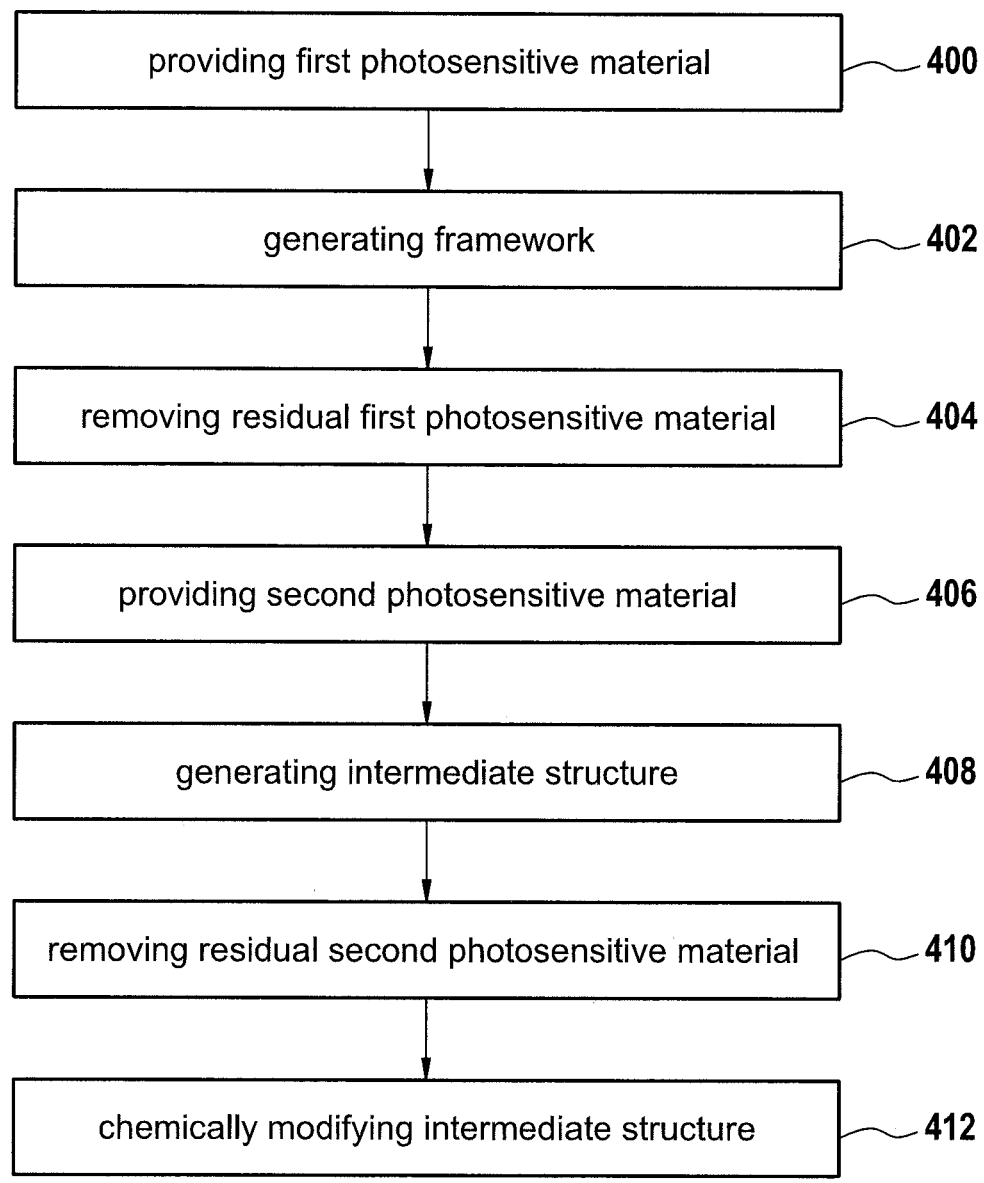
FIG. 4 is a flowchart depicting steps for producing a structure with spatial encoded functionality.

The operation of the controller 100 becomes clear when discussed in combination with the flowchart in FIG. 4. In step 400 a first photosensitive material is provided in a volume. In FIG. 1 the photosensitive material is indicated with reference numeral 116 and the volume is a vessel 114. The photosensitive material 116 is two-photon crosslinking compatible, i.e. the interaction of the electromagnetic radiation of the laser beam 118 admitted by the laser source 112 induces chemical bond formation or in the photosensitive material 116. The photo cross-linking is first initiated by photoinitiators that are comprised with the photosensitive material 116. These photoinitiators exhibit high absorption at the specific wavelength of the laser light used in the above described process. Due to the absorption of the laser light by the photoinitiators, free radicals are generated by the photoinitiators. The free radicals are then in using the crosslinking reaction in the photosensitive material 116.

In step 402 of FIG. 4, the framework of cross-linked first photosensitive material is generated by exposing the first photosensitive material 116 with the laser beam 118 emitted by the laser source 112. For that purpose, the laser beam 118 is focused according to the pattern 108 stored in the memory 104. For example, the pattern 108 may be represented using a specific CAD model of the desired 3D framework.

Due to the exposure of the first photosensitive material to the focused laser beam 118 adds the predefined positions specified via the pattern 108, the photosensitive material 116 experiences a cross-linking at this predefined positions and thus forms the three-dimensional framework. After the generating of the framework in step 402, any first photosensitive material that is remaining in a non-crosslinked manner in the vessel 114 is removed from the vessel in step 404, for example by washing out the non-crosslinked portions with the solvent.

Thereupon, in step 406 and the second photosensitive material is provided to the vessel 114 which already contains the cross-linked first photosensitive material, i.e. the framework. The provision of the second photosensitive material leads to an penetration of the second photosensitive material into the framework, however without any formation of chemical bonds between the second photosensitive material and the first photosensitive material of the framework.

The chemical bonds are again formed using the laser source 112 that emits a further laser beam 118 in accordance with a further pattern 108 stored in the memory 104. This time, the pattern is defined in such a manner that at specific locations on the surface of the framework a two-photon crosslinking between the first photosensitive material and a second photosensitive material is occurring. In this way, an intermediate structure 408 is generated. In case the second photosensitive material already represents the desired functionality, like for example in a desired optical absorbance, mechanical behavior, selectivity of bonding to specific proteins etc. the intermediate structure 408 corresponds at the same time it to the final structure having the spatially encoded functionality.

In any case, in subsequent step 410 any receipt will second photosensitive material that was not cross-linked while generating the immediate structure in step 408 is removed. The removing of the non-crosslinked second photosensitive material may also be performed by immersing the intermediate structure in the respective solvent that specifically solves the non-crosslinked second photosensitive material.

In case the second photosensitive material does not directly represent the spatial encoded functionality, the method continues in step 412 with the chemical modification of the intermediate structure. The chemical modification is performed in such a manner that specifically the second photosensitive material is subject to its two and chemical treatment such that due to the chemical treatment the second photosensitive material is chemically modified. Typically, the cross-linked portions of the second photosensitive material have some reactive sites that can be specifically chemically modified using one or more chemicals until the sites possess the desired encoded functionality.

Figure 2:
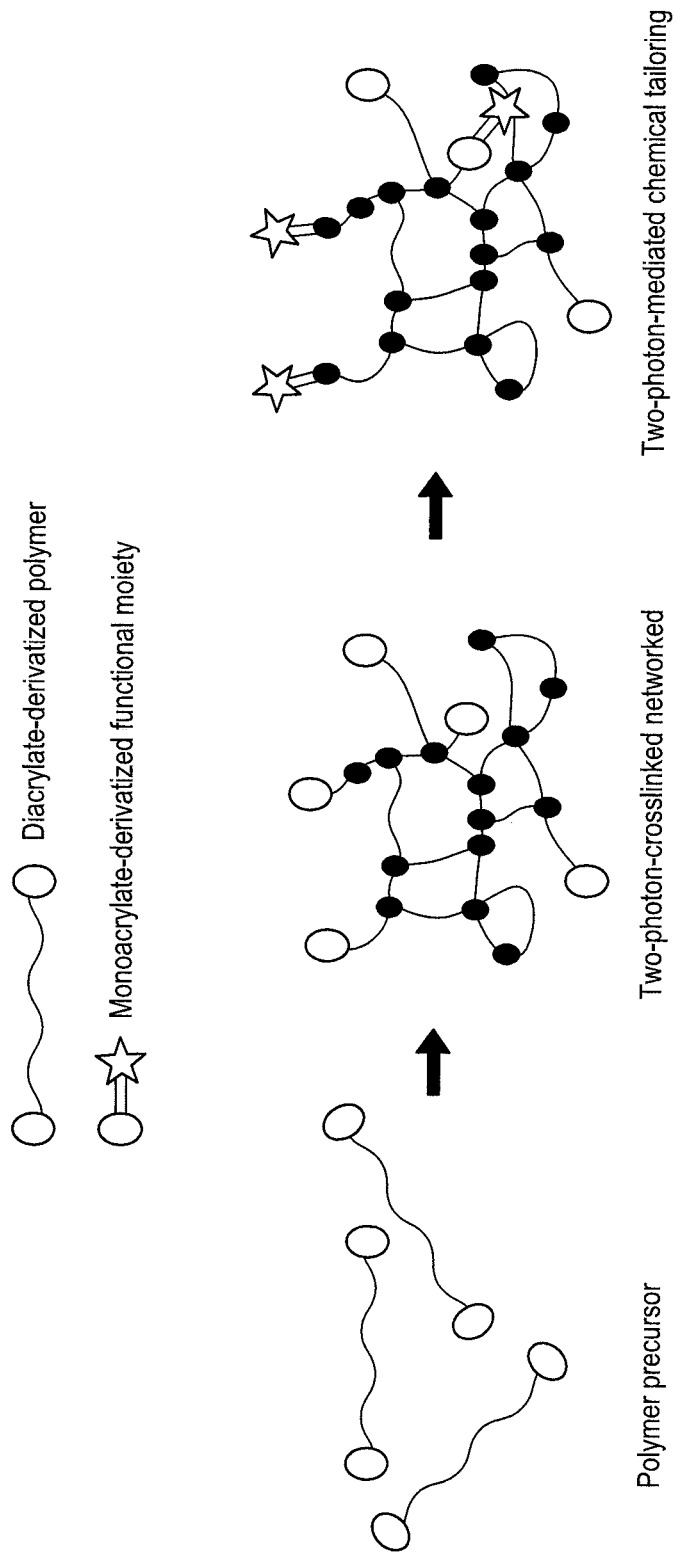
FIG. 2 shows a schematic illustrating TCP microprinting and following chemical patterning of a poly(ethylene glycol) diacrylate (PEGDA) network at the molecular scale.

FIG. 2 shows a schematic illustrating TCP microprinting and following chemical patterning of a poly(ethylene glycol) diacrylate (PEGDA) network at the molecular scale. In the first step, diacrylate-derivatized PEG is crosslinked based on TPC within the bulk of the precursor solution. This reaction leaves some of the acrylate groups unreacted. This enables a second round of crosslinking reaction with unreacted acrylates present on the structured network and monoacrylate-derivatized functional molecules. The degree of chemical patterning reaction yield correlates with the amount of the laser exposure dose, which is a function of exposure time and laser intensity, applied to the structure as described further in FIG. 6.

Figure 3:
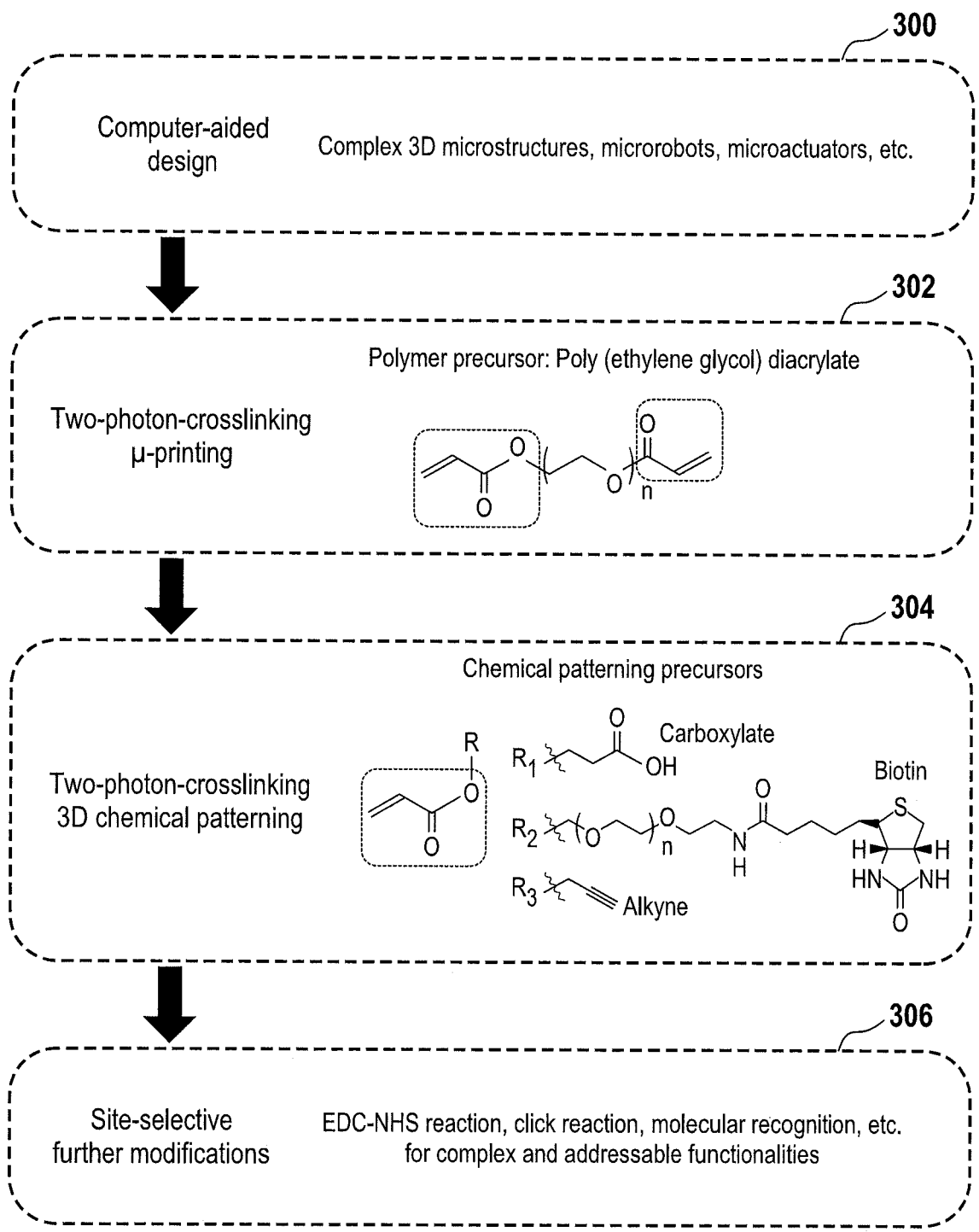
FIG. 3 depicts a flowchart of a more specific example of producing a structure with spatial encoded functionality.

FIG. 3 depicts a flowchart of a more specific example in which the method steps of FIG. 4 were employed. In the first step 300, a complex 3D CAD design is realized for the application of interest. This structure is then microprinted by means of spatiotemporally-controlled TPC of di- or polyacrylate-derivatized polymer precursor (step 302). The unreacted polymer precursor is then completely removed, and a new precursor solution containing the monoacrylate-derivatized functional molecules is introduced. 3D chemical patterning is accomplished by TPC at predetermined locations of the microstructure between the existing free acrylate groups on the structure network and the newly introduced functional molecules (step 304). Now that functional sites are generated, spatiotemporal further processing becomes easier until the final chemical functionality is achieved (step 306). The patterning strategy can be repeated for multiple times for various molecules at different locations of the same material depending on the functional complexity required for a given application.

Figure 5:
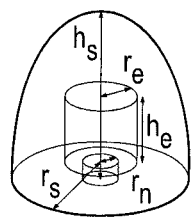
FIG. 5 is an overview of the relaxation process and the chemical reactions for a functional 3-D patterning of a self-propulsive microswimmer.
Figure 5:
Figure 5:
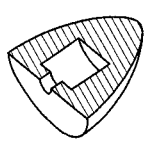
Figure 5:
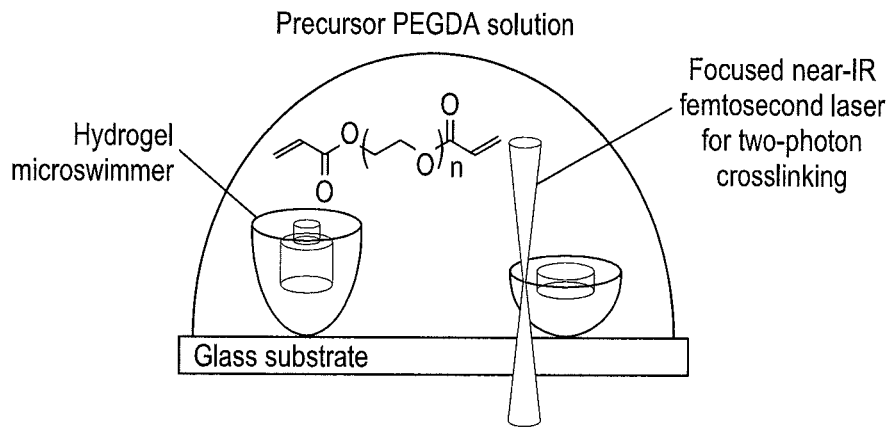
Figure 5:
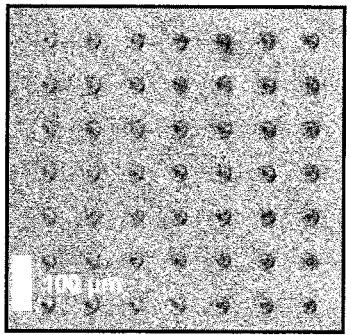
Figure 5:
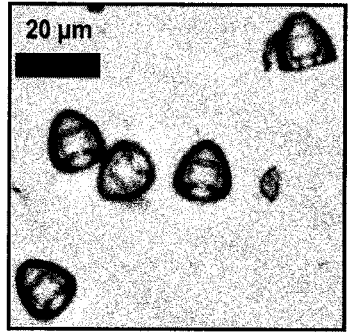
Figure 5:
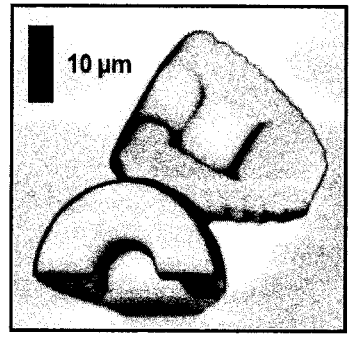
Figure 5:
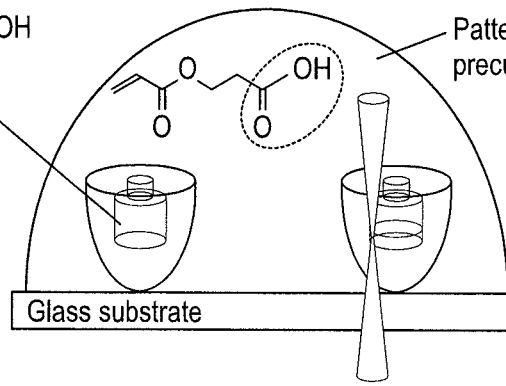
Figure 5:
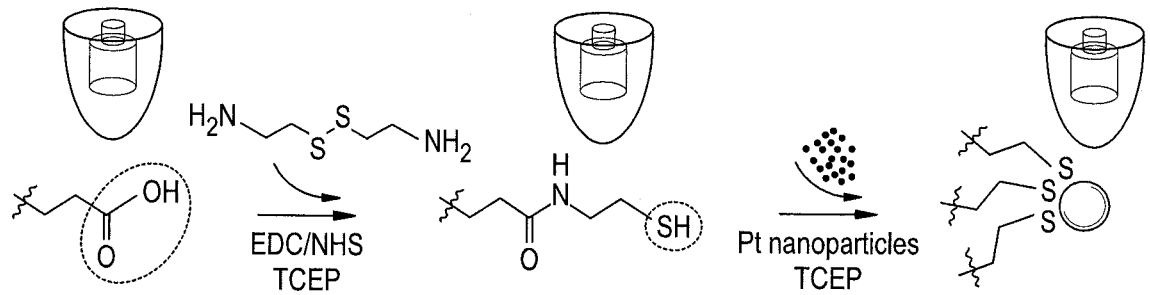
Figure 5:
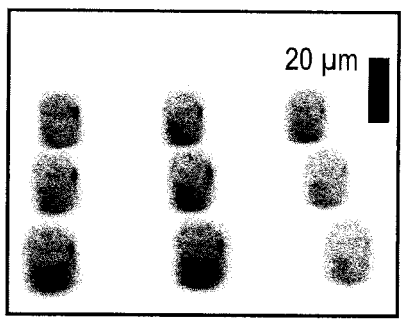
Figure 5:
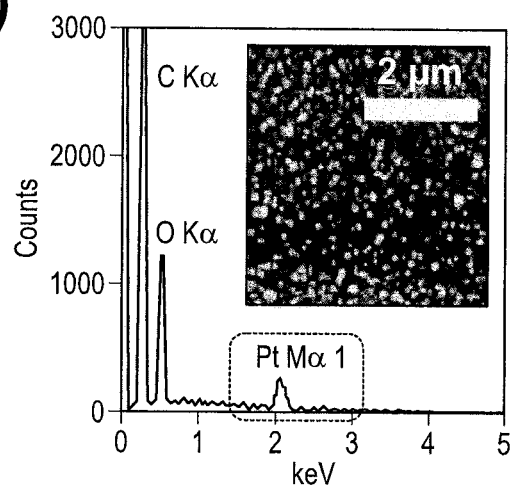
Figure 5:
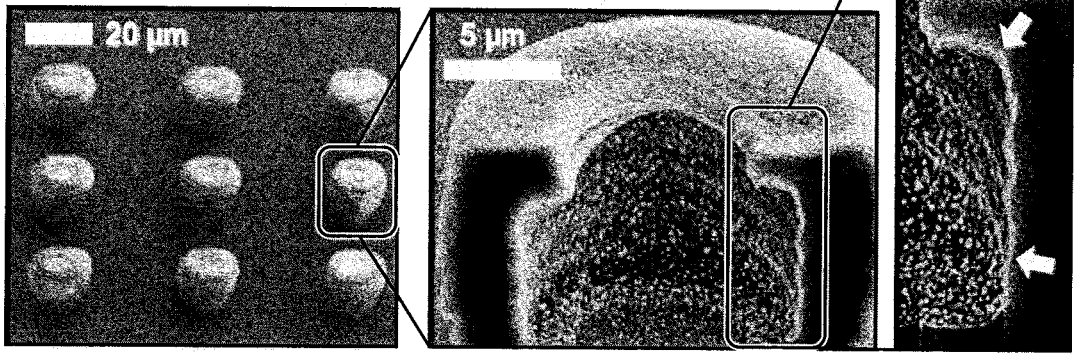

An example of a structure with the spatial encoded functionality is a self-propelled microswimmer operating at the low-Reynolds-number regime that needs to do work in order to move its body against the viscous drag. FIG. 5 is an overview of the relaxation process and the chemical reactions for a functional 3-D patterning of the self-propulsive microswimmer. A 3D bullet-shaped low-drag body was designed with an inner cavity opened to outside environment through a small nozzle where fuel-driven catalytic reaction will produce jet bubbles to thrust the motility. FIG. 5a shows the CAD design of the low-drag bullet-shape microswimmer with a programmed inner cavity as catalytic bubble-production site, or engine, that opens outside through a nozzle to produce jet bubbles for propulsion. It is the goal to selectively address the 3D cavity by decorating the cavity surface with catalytic platinum nanoparticles so as to create a compartmentalized fuel-burning engine site for an efficient microswimmer. PEGDA was used as the first photosensitive material. To this end, first, chemically uniform PEGDA microswimmers are printed as frameworks in well agreement with their CAD designs in terms of overall structural fidelity and dimensions. FIG. 5b depicts the TPC microprinting of hydrogel microswimmers made of PEGDA using a focused near-IR femtosecond laser for the two-photon crosslinking. Robust microswimmer arrays are printed without a detectable structural disparity among the individuals. FIG. 5c is an optical micrograph of a 7×7 array of microswimmers printed in a serial process. In a top view of the microswimmers with their pointy heads attached to the glass substrate are visible.

The inner cavities of the frameworks are well-structured and the overhanging nozzle sites are found well-preserved relying on their original CAD design. This can be seen from FIGS. 5d and 5e. FIG. 5e is a scanning electron microscope (SEM) micrograph of cross-sectional-printed microswimmers that shows the well-preserved overhanging nozzle and the inner cavity during printing. Following the microprinting, the unreacted polymer precursor is thoroughly removed by dissolving it in an isopropyl alcohol/acetone solution; therefore leaving the bare structures attached on the supportive glass substrate for the 3D patterning.

To pattern the cavity surface with carboxylate moieties, 2-carboxyethyl acrylate (R1) was used as the second photosensitive material as illustrated in FIG. 5f. FIG. 5f depicts schematically the 3D chemical patterning of the inner cavity surface for carboxylate group display. Since R1 is only one-side acrylated, it going to form a monolayer, on the cavity surface, resulting in spatially precise carboxylate group display. Creating initial chemical asymmetry enables site-selective further processing for desired functional properties.

The patterned carboxylate groups were then converted to sulfhydryl groups, which have stronger affinity for platinum nanoparticles to be decorated with (FIG. 5g depicting the chemical reaction steps for conversion of carboxylate to sulfhydryl for selective platinum nanoparticle decoration onto the inner cavity surface). This finally leads to the desired 3D structure having as spatial encoded functionality the platinum nanoparticle decoration on the inner cavity surface.

Maleimide-coupled sulfhydryl patterns were selectively distinguished at the cavity site from the rest of the microswimmer body by 3D reconstruction of z-planes with a fluorescent microscope. FIG. 5h is a fluorescent micrograph of a 3×3 microswimmer array with 3D reconstruction of z-stack planes, showing selective sulfhydryl patterning only at the inner cavity site of the microswimmers.

Sulfhydryl patterns then templated the growth of platinum nanoparticles only at the cavity site with an average size of 78 nm. FIG. 5i is a SEM micrograph of 3×3 microswimmer array after patterning with platinum nanoparticles. Focused ion beam cross-sectional cut of a single microswimmer is showing selective platinum nanoparticle decoration on the inner cavity surface. FIG. 5j depicts energy-dispersive X-ray spectroscopy (EDAX) that characterizes the white contrast particles as platinum.

Thus, the 3D patterning reaction was limited only to the target sites whereas the rest of the bulk material remained chemically unaltered. Transparency of the printed structure in the near-infrared radiation while being highly absorptive in the UV range accounts for the non-invasive feature of the TPC and hence the chemical patterning. This cannot be addressed in the same way by other methods such as photolithographic graphic patterning, micro-contact printing, electrochemical deposition and electron or focused ion beam patterning.

To understand the patterning yield in relation with the degree of laser light intensity, which correlates with the square of the amount of two-photon occurrence, and hence the reactive absorption rate, a flat thin hydrogel was fabricated, which was then patterned with R1 by scanning with the femtosecond laser in short dashed lines on the gel surface with varying effective exposure doses. The yield of surface modification was semi-quantitatively evaluated based on the amount of sulfhydryl groups to be coupled with maleimide-conjugated fluorophore for detection under a fluorescence microscope. At lower laser power below 11 mW with 3×10⁴ μm/s scanning speed, there was either no reaction initiation, or it was too low to detect with fluorescence. Above 11 mW, distinct sulfhydryl patterns became distinguishable. 15 mW is determined to provide the maximum achievable patterning density based on the relative fluorescence intensity. Above this, local overheating and bubbling caused PEGDA network to be abruptly damaged. The same exposure dose leading to the maximum patterning efficiency of R1 was therefore used for 3D patterning of the microswimmer cavity.

Figure 6:
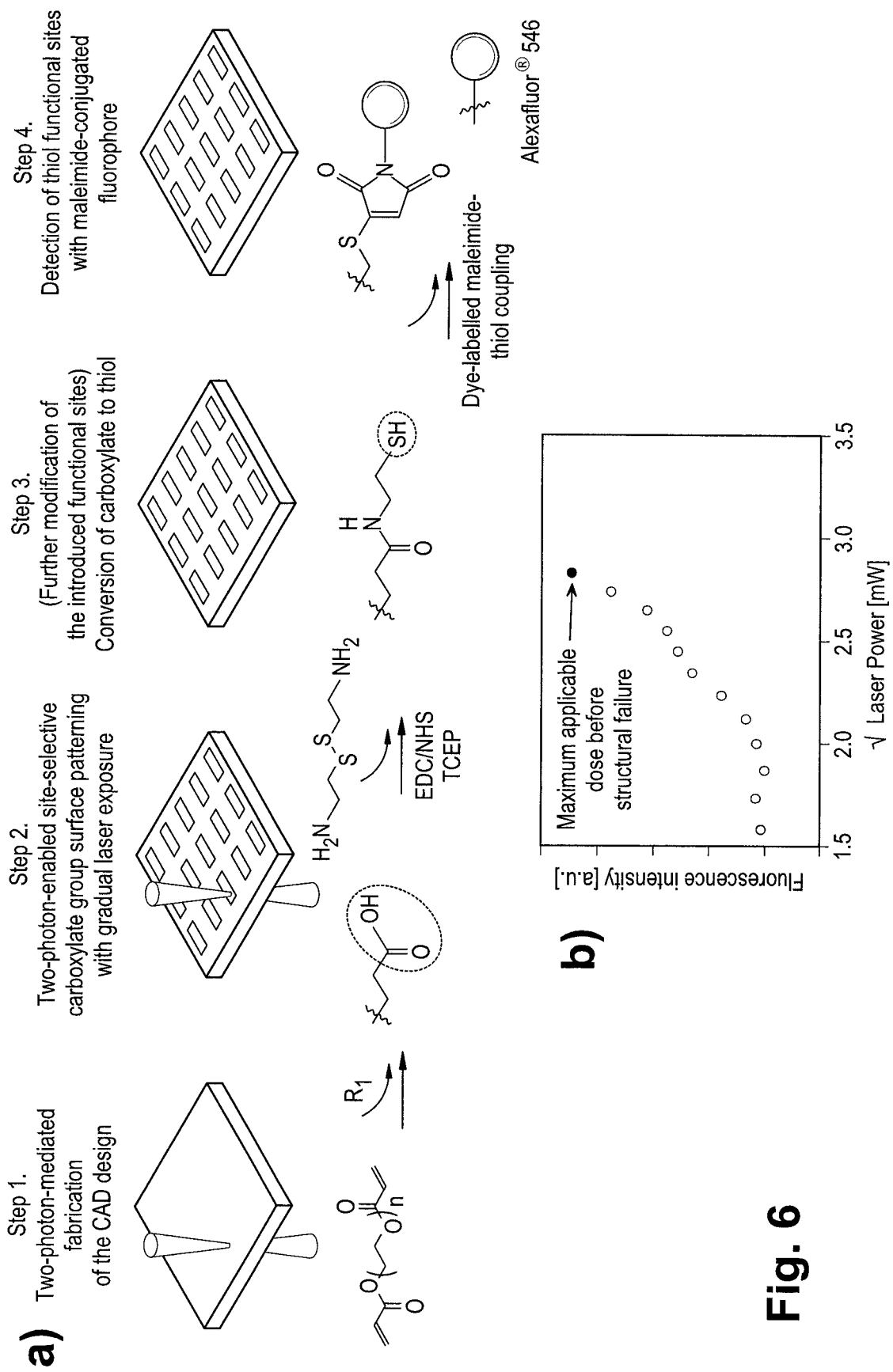
FIG. 6 depicts a schematic used for the determination of the patterning yield as a function of the femtosecond laser exposure dose.

FIG. 6 depicts a schematic used for the determination of the patterning yield as a function of the femtosecond laser exposure dose. FIG. 6a shows a thin flat hydrogel of PEGDA that was printed with the dimensions of 60×60×5 $\mu m^3$. R1 was patterned on this microstructure as short dashed two-dimensional lines, 10×2×2 $\mu m^3$. Carboxylate functional groups were then converted to sulfhydryl, which was evaluated under fluorescence microscope by means of Alexafluor 546-labeled maleimide-sulfhydryl coupling. Fluorescent micrographs of the patterned PEGDA hydrogel were thus analyzed regarding their labeled sulfhydryl presence. As can be seen from FIG. 6b, increase in the exposure laser dose leads to higher fluorescent intensity, indicating higher modification yield. Nevertheless, above a threshold dose achieved at 16 mW laser power and 3×10⁴ μm/s galvanometric mirror speed, the hydrogel suffers from structural damage, and thereby nullifying the patterning process. Until this threshold dose is achieved, the fluorescence intensity does not reach a plateau. As a result, the highest achievable patterning yield is evaluated as the highest exposable laser dose that does not cause a structural damage to the base material.

In summary, a robust platform based on TPC chemistry for micromanufacturing light-sensitive materials with programmable functionality was described. Addressing the large gap between intricate 3D CAD designs and corresponding physical realizations as sophisticated functional micromaterials has been long sought yet unattainable goal thus far. To realize this, structural complexity provided by TPC microprinting was combined with spatiotemporally controlled chemical patterning and a bullet-shape catalytic microswimmer was demonstrated with well-controlled compartmentalization. Since the motion at this small size scale suffers greatly from the viscous drag, an optimal 3D microswimmer body design is an important direction to gain maximum propulsion efficiency. Such untethered active materials could be particularly attractive for microrobotics and medical cargo carrier applications. Novel 3D microswimmer and microactuator designs could drastically increase in number and variety based on the conceptual strategy described herein. Chemically orthogonal multiple pattering paves the way for versatile functionalities to be encoded so as to achieve more complex, multitasking materials with active and passive components, potentially in the applications of minimally-invasive smart cargo delivery, tissue engineering and biohybrid actuators.

In the following, details regarding the employed methods and materials are exemplary described. However, these methods and materials are only presented as examples to illustrate the general feasibility of the invention.

A commercially available Direct Laser Writing system (Photonic Professional, Nanoscribe GmbH) equipped with a 63× oil-immersion objective (NA 1.4) was used to manufacture 3D microstructures designed in CAD software (Solidworks). Laser power and galvanometric mirror scanning speed were optimized for writing as 23 mW and 1.4×10⁴ μm s-1, respectively. Poly(ethylene glycol) diacrylate (Mn≈250) precursor solution containing 3% (w/v) Irgacure® 369 photoinitiator was dropped onto the 3-(Trimethoxysilyl)propyl methacrylate-treated glass slide, on which the fabrication was carried out.

Following the complete removal of the unreacted PEGDA precursor in isopropyl alcohol/acetone (4:1 v/v), the microstructures on the glass substrate were treated with R1 solution containing 3% (w/v) lithium phenyl-2,4,6-trimethhylbenzophosphinate (LAP) initiator. Diffusion of the patterning precursors into the structures was allowed for 1 h. After the reaction, the unreacted precursor was removed in isopropyl alcohol/acetone, followed by hydration in gradually increasing concentrations of isopropanol/water solutions. Sulfhydryl generation was accomplished by conjugation of introduced carboxylate groups to cystamine using EDC/sulfo-NHS activation followed by reduction of S—S bonds using tris(2-carboxyethyl)phosphine hydrochloride (TCEP). To decorate with the platinum nanoparticles, initially 3 nm platinum seeds (100 ppm in TCEP/water) were introduced to create nucleation sites, onto which larger nanoparticles were grown using 0.05 mM hydrogen hexachloroplatinate (IV) hexahydrate containing 5 mM ascorbic acid solution for 48 h at room temperature.

In a further example a structure with fluorescently labelled functional groups may be generated, the fluorescently labelled functional groups serving as the spatial encoded functionality. For multipatterning on a model PEGDA, sulfhydryl patterning was carried out as described above by addressing the crown surface of the flower. For detection, alexafluor-488-conjugated maleimide was used to couple it to the reduced sulfhydryl. Biotin patterning on the surface of the leaves was achieved using 3% (w/v) acrylate-PEG-biotin (R2) (1 kDa, Creative PEGworks) and 3% (w/v) LAP-containing aqueous solution. Detection of surface biotin was carried out by Cy3-conjugated streptavidin that selectively interacts with biotin by non-covalent interactions. Alkyne patterning of the stem surface of the flower was carried out by 10% (v/v) propalgyl acrylate (R3) and 3% (w/v) Irgacure® 369 containing dimethylformamide (DMF). Detection was achieved by copper(I)-catalyzed azide-alkyne cycloaddition reaction with Cy5-conjugated azide.

In the following, the chemical reactions for the chemical patterning are described: conversion to sulfhydryl from carboxylate groups was achieved by reacting 2,2'-diaminodiethyl disulfide dihydrochloride with the activated carboxylicacid groups using EDC/sulfo-NHS activation. Briefly, 2 mM 1-Ethyl-3-(3-Dimethylaminopropyl) carboimide. HCl (EDC, ThermoFischer) and 5 mM N-Hydroxysulfosuccinimide (sulfo-NHS ThermoFischer) was dissolved in 2-[N-morpholino]ethane sulfonic acid (MES) buffer at pH 4.5 and used to activate carboxylate groups for 20 min. After several washes with MES buffer and PBS, 0.04 M 2,2'-diaminodiethyl disulfide dihydrochloride was coupled in PBS at pH 7.2 for 2.5 h at room temperature. Following a thorough washing with PBS and ultrapure water, structures were incubated in 100 μM tris(2-carboxyethyl)phosphine hydrochloride (TCEP) in water for 2 h, so as to reduce S—S bonds and generate available sulfhydryl groups. To confirm the presence of sulfhydryl, 1 μM of Alexa Fluor® 546-C5 maleimide (Invitrogen) was added for sulfhydryl-maleimide conjugation for 2 h at room temperature. The fluorescently labeled patterns were then investigated under the microscope.

Staining of patterned sites was achieved in a sequential treatment with the labeling agents. First, carboxylate groups were activated by EDC/sulfo-NHS chemistry in MES buffer, pH 4.5 and 0.04 M 2,2'-diaminodiethyl disulfide dihydrochloride was coupled in PBS, pH 7.2 for 2.5 h at room temperature as described above in detail. After washing with PBS and deionized water, copper(I)-catalyzed azide-alkyne cycloaddition reaction was performed. Structures were incubated in reaction cocktail including 1 μM Alexa Fluor® 647 azide, prepared according to manufacturer's instructions (Invitrogen, Click-it Cell reaction kit), at room temperature for 1 h. After several washes with deionized water, 100 μM TCEP was used to generate reduced sulfhydryl groups from previously conjugated 2,2'-diaminodiethyl disulfide dihydrochloride. 1 μM Alexa Fluor®-488-Maleimide was then used for sulfhydryl-specific coupling. After further washing with deionized water and PBS sequentially, structures were incubated in Cy-3-Streptavidin (Invitrogen) conjugate diluted in PBS (1:50 containing 5% HS) at room temperature for 1.5 h. All the staining procedure was performed at dark.

Regarding synthesis of water-soluble photoinitiator, 3.2 g 2,4,6-trimethylbenzoyl chloride was added to equimolar dimethyl phenylphosphonite (3.0 g) under argon and reaction was stirred continuously for 18 h. 6.1 g Lithium bromide dissolved in 100 mL 2-butanone was added to the reaction mixture, which was then heated up to 50° C. After 10 min, the mixture was allowed to rest for 4 h and cooled to room temperature. 12 μm pore size paper filter was used to filter the precipitate for 3 times while washing with 2-butanone. All residual solvent was removed under vacuum. The initiator was kept at −20° C. until use.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wireline, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

REFERENCE NUMERALS 100 controller
102 processor
104 memory
106 instructions
108 pattern
110 interface
112 laser source
114 vessel
116 photosensitive material
118 laser beam 118

The invention claimed is:

1. Method for producing a structure with spatial encoded functionality, the method comprising:
providing, in a volume formed on a glass substrate, a first photosensitive material that is two-photon crosslinking compatible, wherein the first photosensitive material is a hydrogel,
generating in the volume a framework of crosslinked first photosensitive material, the generating of the framework comprising exposing the first photosensitive material with a first focused laser beam according to a first pattern for specifically initiating a two-photon crosslinking of the first photosensitive material in accordance with the first pattern,
removing from the volume any remaining non-crosslinked portions of the first photosensitive material, wherein the framework comprises an array of first structures,
providing to the volume a second photosensitive material that is two-photon crosslinking compatible,
generating in the volume the structure, the generating of the structure comprising exposing the second photosensitive material with a second focused laser beam according to a second pattern for specifically initiating a two-photon crosslinking of predefined surface portions of each first structure of the array of first structures and the second photosensitive material in accordance with the second pattern,
removing from the volume any remaining non-crosslinked portions of the second photosensitive material, the remaining crosslinked portions of the second photosensitive material having reactive sites, wherein the structure comprises the array of first structures having respective reactive sites, wherein each first structure of the array of first structures is separated from remaining first structures of the array of first structures, wherein each first structure of the array of first structures is a microswimmer, and wherein each microswimmer has a pointy head chemically bonded to the glass substrate, and chemically modifying at least part of reactive sites with one or more chemicals until the reactive sites possess a desired encoded functionality, wherein the chemicals are chemically inert to the first photosensitive material.

2. The method of claim 1, further comprising after the removal of the remaining non-crosslinked portions of the second photosensitive material and before performing the chemical modification: defunctionalizing any reactive sites of the framework that are reactive to the one or more chemicals used for performing the chemical modification.

3. The method of claim 1, the chemical modification with the one or more chemicals comprising immersing the structure subsequently in the one or more chemicals.

4. The method of claim 1, the desired encoded functionality being given by the remaining crosslinked portions of the second photosensitive material.

5. The method of claim 1, the removal from the volume of any remaining non-crosslinked portions of the first photosensitive material comprising a dissolving of the non-crosslinked portions in a solvent.

6. The method of claim 1, the first and/or second pattern defining spatial features of the first and/or second photosensitive material at a resolution in between 5 nm and 500 µm.

7. The method of claim 1, the first and the second photosensitive material being each provided to the volume homogeneously together with a respective photoinitiator, the photoinitiator being adapted for initiating the two-photon crosslinking of monomers of the respective first and second photosensitive material upon exposure of the photoinitiator to the respective first and second focused laser beam.

8. The method of claim 1, the hydrogel being a derivative of anyone of the following: polyvinyl alcohol, polyethylene glycol, polyethylene oxide, poly(2-hydroxyethyl methacrylate), polyacrylamide, gelatin and protein derivatives.

9. The method of claim 8, the derivative being an acrylate or methacrylate resin.

10. The method of claim 9, the hydrogel being poly (ethylene glycol) diacrylate (PEGDA).

11. The method of claim 1, the second photosensitive material comprising mono-acrylate-derivatized molecules.

12. The method of claim 1, wherein exposing the second photosensitive material with the second focused laser beam comprises scanning the second photosensitive material with the second focused laser beam at $3\times10^4$ um/s, the second focused laser beam generated from a laser operating at 11-16 mW power.

13. The method of claim 1, wherein the desired encoded functionality of the reactive sites comprises an affinity for platinum nanoparticles.

* * * * *